(12) United States Patent  
Perner et al.

(10) Patent No.: US 7,031,185 B2  
(45) Date of Patent: Apr. 18, 2006

(54) DATA STORAGE DEVICE AND METHOD OF FORMING THE SAME

(75) Inventors: Frederick A. Perner, Palo Alto, CA (US); Andrew L. VanBrocklin, Corvallis, OR (US); Warren B. Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/171,694

(22) Filed: Jun. 30, 2005

(65) Prior Publication Data

US 2005/0237845 A1    Oct. 27, 2005

Related U.S. Application Data

(62) Division of application No. 10/657,385, filed on Sep. 8, 2003, now Pat. No. 6,937,509.

(51) Int. Cl.
 *G11C 11/14* (2006.01)

(52) U.S. Cl. .................... 365/171; 365/105; 365/173

(58) Field of Classification Search ............... 365/171, 365/105, 173, 158
See application file for complete search history.

(56) References Cited

U.S. PATENT DOCUMENTS

| | | | |
|---|---|---|---|
| 5,793,697 A | * | 8/1998 | Scheuerlein ........... 365/230.07 |
| 6,356,477 B1 | | 3/2002 | Tran |
| 6,456,524 B1 | | 9/2002 | Perner et al. |
| 6,567,299 B1 | * | 5/2003 | Kunikiyo et al. ........... 365/173 |
| 6,731,535 B1 | * | 5/2004 | Ooishi et al. ............... 365/171 |
| 6,754,123 B1 | * | 6/2004 | Perner et al. ............... 365/209 |

FOREIGN PATENT DOCUMENTS

WO   PCT/US2004/030593        5/2005

* cited by examiner

*Primary Examiner*—Anh Phung (57) ABSTRACT

A resistive cross point memory cell array comprising a plurality of word lines, a plurality of bit lines, a plurality of cross points formed by the word lines and the bit lines, and a plurality of memory cells, each of the memory cells being located at a different one of the cross points, wherein a first bit line comprises a distributed series diode along an entire length of the bit line such that each of the associated memory cells located along the first bit line is coupled between the distributed series diode and an associated word line.

20 Claims, 7 Drawing Sheets

DATA STORAGE DEVICE AND METHOD OF FORMING THE SAME

CROSS REFERENCE TO RELATED APPLICATIONS

This application is a divisional application, which is based on and claims priority to U.S. Utility patent application Ser. No. 10/657,385, filed on Sep. 8, 2003, now U.S. Pat. No. 6,937,509, issued on May 4, 2004, and which is incorporated by reference herein in its entirety.

BACKGROUND

Many different resistive cross point memory cell arrays have been proposed, including resistive cross point memory cell arrays having magnetic random access memory (MRAM) elements, phase change memory elements, resistive polymer memory elements, polysilicon memory elements, and write-once (e.g., fuse based or anti-fuse based) resistive memory elements.

A typical storage device, for example, an MRAM storage device, includes an array of memory cells. Word lines may extend along rows of the memory cells, and bit lines may extend along columns of the memory cells. Each memory cell is located at a cross point of a word line and bit line. Each memory cell stores a bit of information as an orientation of a magnetization. In particular, the magnetization of each memory cell assumes one of two stable orientations at any given time. These two stable orientations, parallel and anti-parallel, may, for example, represent logic values of 0 and 1. The magnetization orientation affects the resistance of a memory cell. For example, the resistance of a memory cell may be first value, R, if the magnetization orientation is parallel, and the resistance of the memory cell may be increased to a second value, R+ΔR, if the magnetization orientation is changed from parallel to anti-parallel.

In general, the logic state of a resistive cross point memory cell may be read by sensing the resistance state of the selected memory cell. However, sensing the resistance state of a single memory cell in the array typically is difficult because all of the memory cells in a resistive cross point memory cell array are interconnected by many parallel paths. Thus, the resistance that is determined at one cross point equals the resistance of the memory cell at the cross point in parallel with the resistance of memory cells in the other word lines and bit lines. This means that, in an array that does not use switches or diodes to isolate memory cells from one another, the other memory cells in the same column and row may be rendered unusable. Thus, a simple shorted memory element can cause a column-wide/row-wide error. In addition, if the selected memory cell being sensed has a different resistance state due to stored magnetization, a small differential voltage may develop. This small differential voltage may give rise to parasitic or "sneak path" currents that may interfere with the sensing of the resistance state of the selected memory cell.

Thus, a need exists for the reliable isolation of selected resistive cross point memory cells while data stored on a selected memory cell is being sensed.

SUMMARY

The present disclosure relates to data storage devices and methods for forming a data storage device. In one embodiment, a data storage device comprises a plurality of word lines, a plurality of bit lines, a plurality of cross points formed by the word lines and the bit lines, and a plurality of memory cells, each of the memory cells being located at a different one of the cross points, wherein a first bit line comprises a distributed series diode along an entire length of the bit line such that each of the associated memory cells located along the first bit line is coupled between the distributed series diode and an associated word line.

In one embodiment, a method for forming a data storage device comprises forming a plurality of word lines in a first plane, each of the word lines being substantially parallel to the other word lines, forming a plurality of memory elements on the plurality of word lines, and forming a plurality of bit lines, each bit line being a distributed series diode, the plurality of bit lines being disposed in a second plane that is substantially parallel to the first plane, thereby forming a plurality of cross-points with the plurality of word lines, wherein each memory element is disposed at one of the cross points.

DESCRIPTION OF DRAWINGS

The methods and devices of this disclosure can be better understood with reference to the following drawings. The drawings are not necessarily to scale.

DETAILED DESCRIPTION

In the following detailed description, reference is made to the accompanying drawings which form a part hereof, and in which are shown by way of illustration specific embodiments of cross point memory cell arrays. Other embodiments may be utilized and structural or process changes may be made. The following detailed description, therefore, is not to be taken in a limiting sense.

Figure 1:
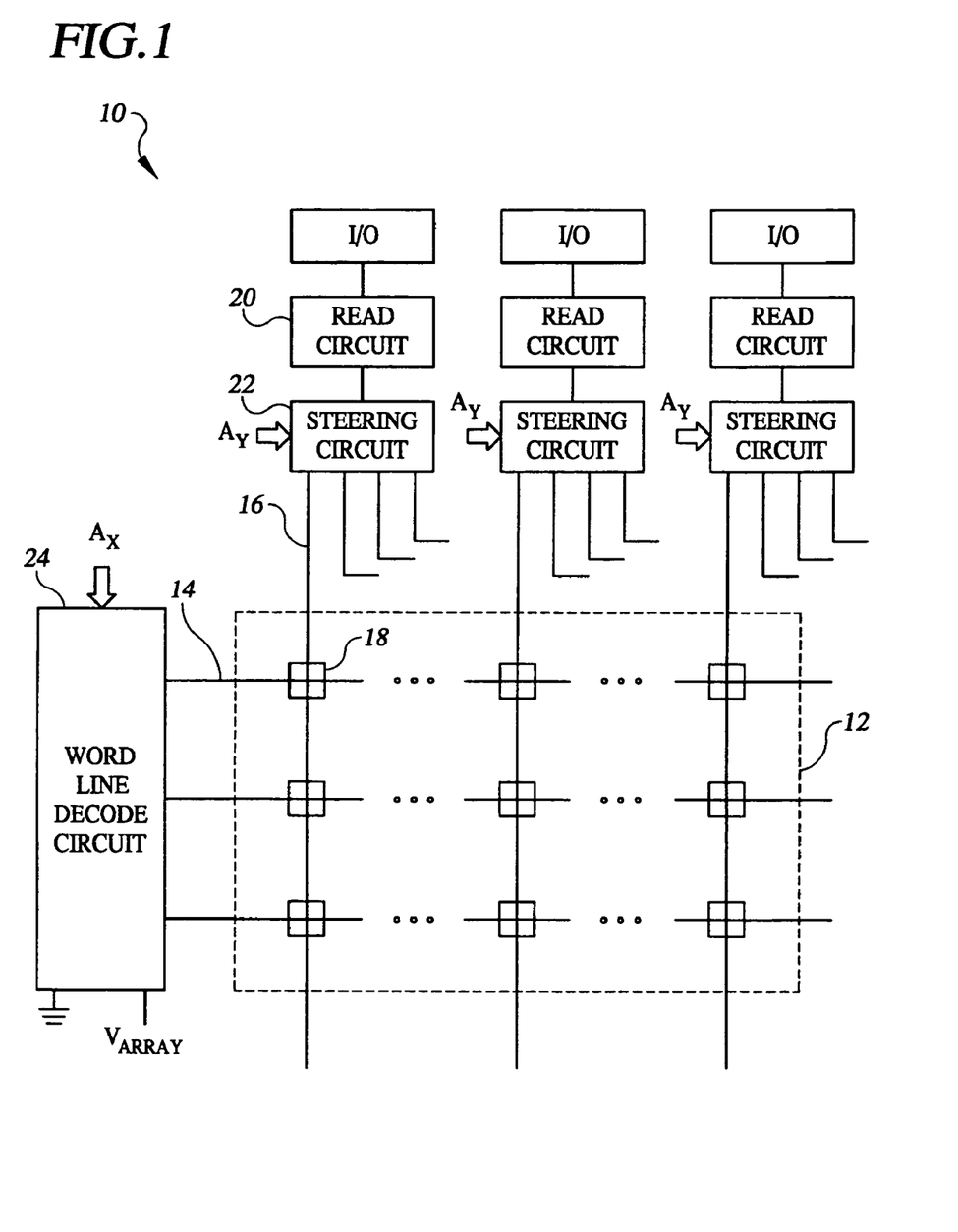
FIG. 1 is a circuit diagram of an embodiment of a data storage device that includes a resistive cross point memory cell array.

Referring to FIG. 1, in one embodiment, a data storage device 10 includes a resistive cross point memory cell array 12, a plurality of words lines 14 that extend along rows of the cross point memory cell array 12, and a plurality of distributed series diode bit lines 16 that extend along columns of the cross point memory cell array 12. The memory cells 18 of memory cell array 12 may be implemented as any one of a wide variety of conventional resistive memory elements, including magnetic random access memory (MRAM) elements, phase change memory elements, resistive polymer memory elements, polysilicon memory elements, and write-once (e.g., fuse based or anti-fuse based) resistive memory elements.

Data storage device 10 also includes multiple read circuits 20, each of which is coupled to one or more associated sets of memory cells 18 by a respective bit line 16. Each read circuit 20 is operable to sense current flow through a memory cell of the associated group (or groups) or memory cells 18. A steering circuit 22 selectively couples an associated read circuit 20 to a selected bit line 16 based upon a received bit line address (Ay). Each steering circuit 22 includes a set of switches that connects each bit line 16 to a source of a constant array voltage ($V_{ARRAY}$) or to an associated read circuit 20. A word line decode circuit 24 selectively activates a particular word line 14 based upon a received word line address (Ax). During read operations, word line decode circuit 24 may activate a selected word line 14 by applying selectively to each of word lines 14 either a constant array voltage ($V_{ARRAY}$) or a read potential. An output of each read circuit 20 is coupled to an input of a respective input/output (I/O) pad of data storage device 10.

In the illustrated embodiment, the resistive cross point memory cell array 12 is shown to have a relatively small number of memory cells 18. Other embodiments, however, may include a large number of memory cells. For example, in one embodiment, resistive cross point memory cell array 12 includes a 1024×1024 array of memory cells 17 and two hundred and fifty-six read circuits 20, each read circuit 20 fitting a pitch of four bit lines 16. In the illustrated embodiment, a total of four bit lines 16 may be multiplexed into each read circuit 20. Some embodiments may include multiple levels of memory cell arrays 12. In those embodiments, bit lines 16 from different levels may be multiplexed into the read circuits 12.

In other embodiments, data storage device 10 may also include a write circuit (not shown) for writing information into the memory cells 18 of the resistive cross point memory cell array 12, hereinafter referred to as memory array 12.

As explained in detail below, the architecture of memory array 12 enables high-density fabrication and high-speed operation with a distributed series diode bit line 16 that has practical dimensions and current density characteristics. In addition, the distributed series diode bit line 16 provides a resistance per unit length that is used to group the word lines 14 of the memory array 12 and act as a resistance element in series with each memory cell 18 of the memory array 12 in order to provide short tolerant operation.

Figure 2:
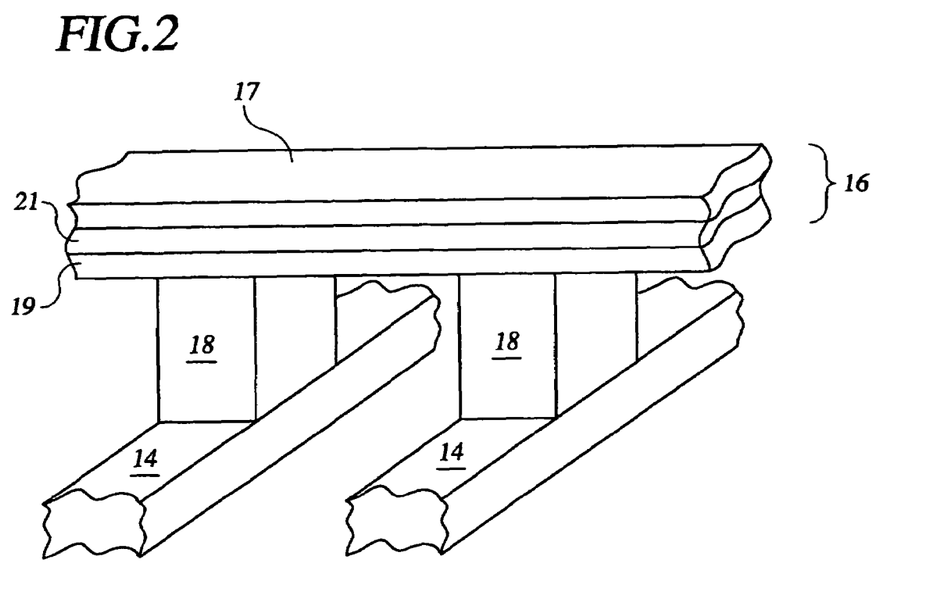
FIG. 2 is a top perspective view of an embodiment of a portion of the resistive cross point memory cell array shown in FIG. 1.

Referring now to FIG. 2, a perspective view of a portion of a memory array 12 is shown including a distributed series diode bit line 16 that provides practical dimensions, current densities, and resistance. As shown, the word lines 14 are typically low resistance conductors made of a metal such as aluminum (Al) or copper (Cu). A memory cell 18 is disposed on the word line 14 such as an MRAM element, a phase change memory cell, a resistive polymer memory cell, a polysilicon memory cell, or a write-once (e.g., fuse based or anti-fuse based) resistive memory cell. Note that multi-layer, multiple cells may be stacked on one another. However, for ease of description, the memory cell 18, regardless of construction, is referred to in the singular tense throughout the application. Distributed series diode bit lines 16, hereinafter referred to as a bit lines 16, are then formed such that each memory cell 18 is disposed between a single word line 14 and a single bit line 16. As shown, the bit line 16 includes a metal layer 17 and a semi-conductor layer 19 that are joined with a material layer 21 that forms a diode therebetween. The metal layer 17 is made of a low resistance metal such as aluminum or copper, while the semi-conductor layer 19 is made of materials such as carbon, silicon, germanium, indium telluride, antinomy telluride, or silicon-tantalum (a semiconductor-metal alloy). Some embodiments of the bit line 16 may have material layers 21 that can be n or p doped semi-conductor materials that form junction diodes with the semi-conductor layer 19. Alternatively, the material layer 21 can be metal such that the material layer 21 and the semi-conductor 19 form a schottky diode.

Figure 3:
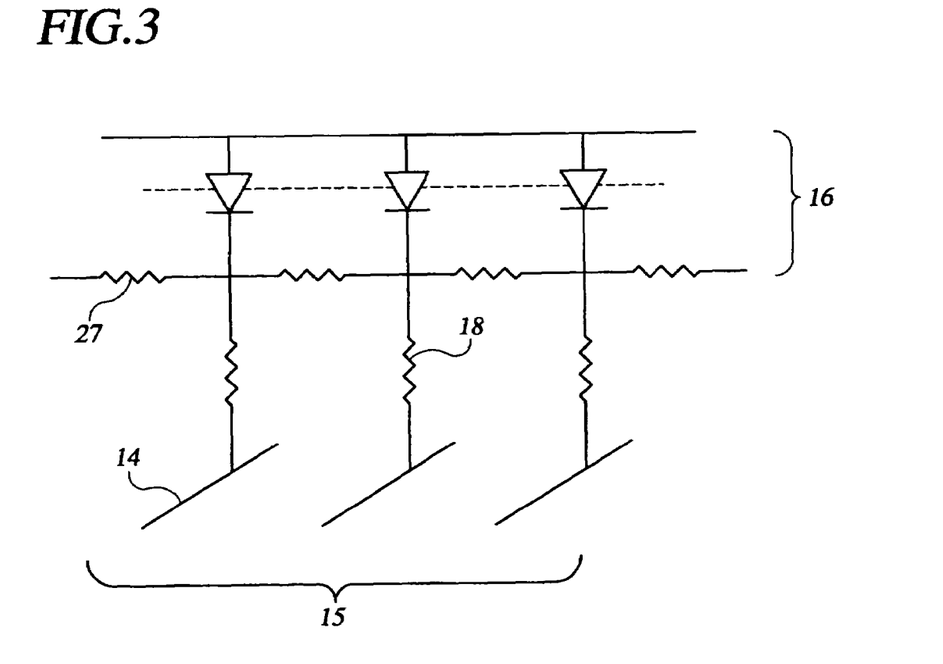
FIG. 3 is a circuit diagram of an embodiment of a portion of a resistive cross point memory cell array shown in FIG. 2.

FIG. 3 is a circuit diagram of the portion of the memory array 12 shown in FIG. 2. By properly selecting the materials of the material layer 21 and the semiconductor layer 19, the resistance per unit length, or lateral resistance, of the bit line 16 can be determined. The materials can be selected such that the bit line 16 exhibits a lateral resistance that allows the word lines 14 associated with a bit line 16 to be effectively grouped. The size of the word line groups 15 depends upon the lateral resistance exhibited by the bit line 16. As shown, the lateral resistance of the bit line 16 is represented by the resistive elements 27, and, by way of example, is selected such that the word lines 14 are arranged in a group of three, although other sized groups are possible. Grouping of the word lines 14 is possible because the lateral resistance of the bit line 16 diminishes the effects of portions of the memory array 12 outside of the group during operations conducted within the word line group 15. For example, during read operations, a shorted memory cell along the selected bit line 16 but outside of the word line group 15 will not affect the read operations. Grouping of the word lines 14 allows the forward characteristics of segments of the distributed diode bit line 16 to be utilized, such that lower current densities are possible than with memory arrays 12 utilizing single diodes for each memory cell. In addition, within the effective word line group 15, the lateral resistance can be treated as a resistance element in series with those memory cells 18 that are not being read. Therefore, if one of the memory cells 18 not being read is shorted, it will not draw excessive current and the memory array exhibits short tolerance within the group of word lines 14.

Figure 4:
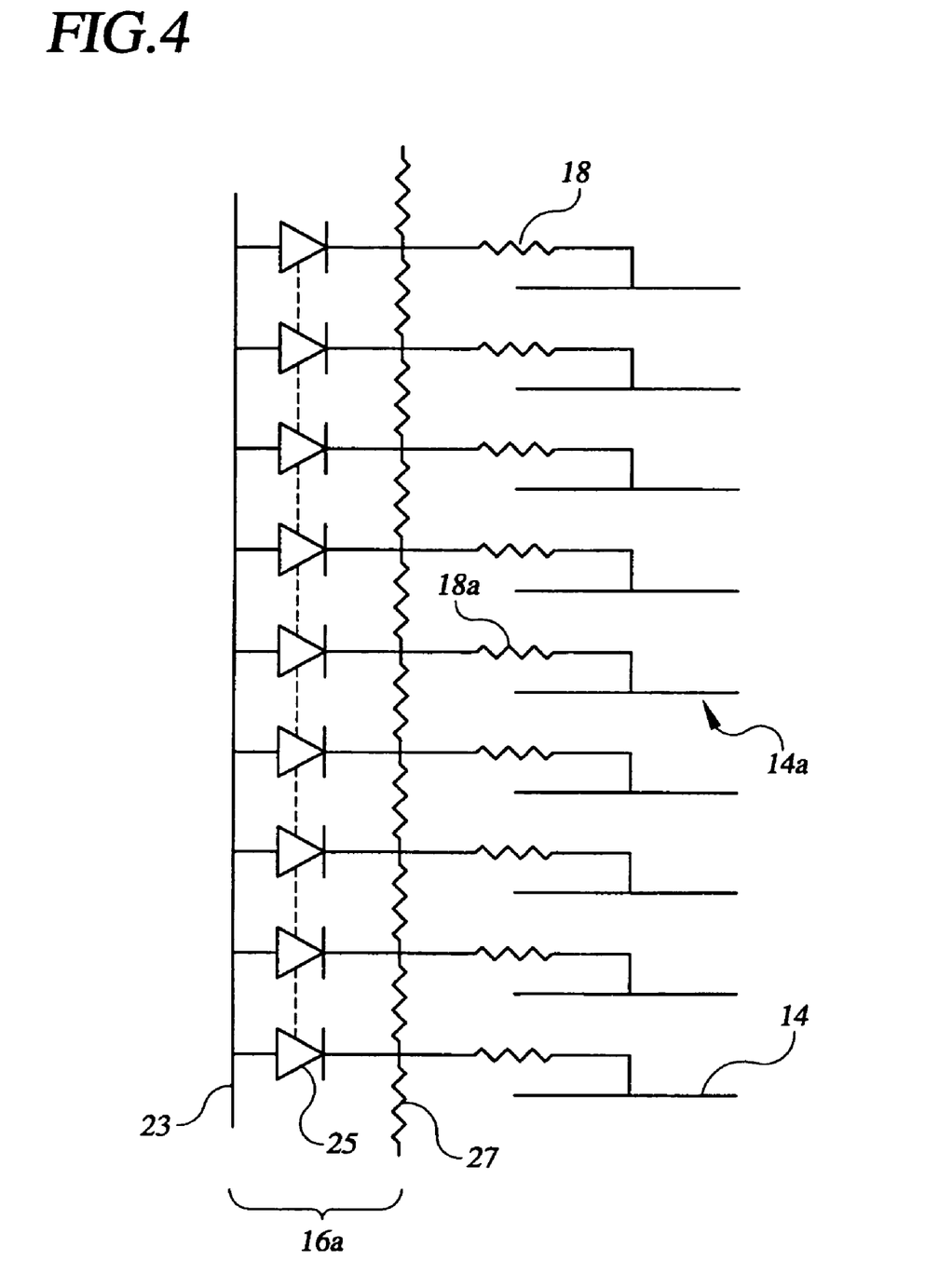
FIG. 4 is a circuit diagram of an embodiment of a portion of the resistive cross point memory cell array shown in FIG. 1, including a distributed series diode bit line.
Figure 5:
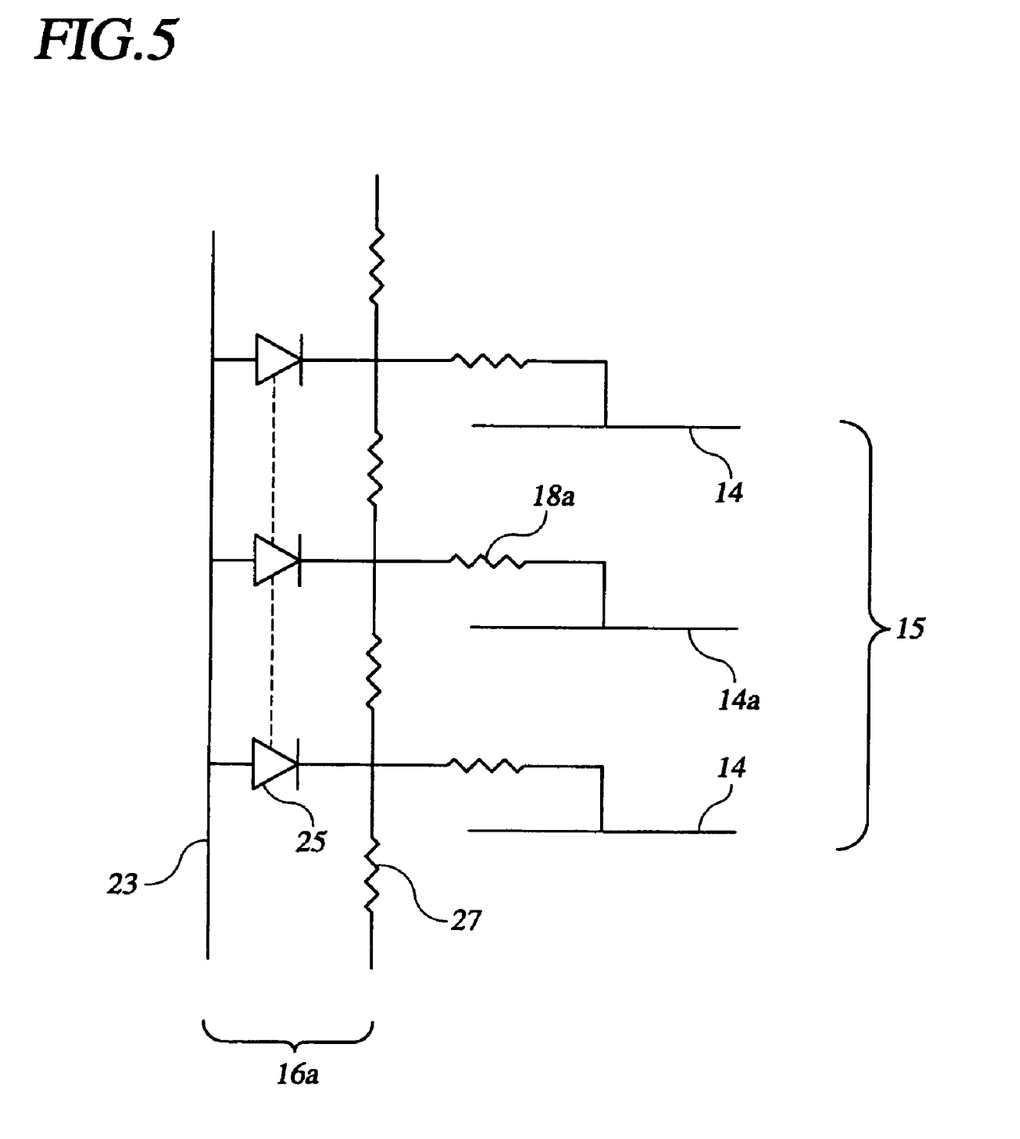
FIG. 5 is a circuit diagram of an embodiment of an effective grouping of word lines by the distributed series diode bit line shown in FIG. 4.

FIG. 4 is a circuit diagram of a distributed series diode bit line 16a and a number of the associated word lines 14 within the memory array 12 (FIG. 1). The metal layer 17, the material layer 21 and the semiconductor layer 19 (FIG. 2) are shown by the lumped electrical model of bit line 16a including the metal bit line 23, diode elements 25, and resistive elements 27. Although individual electrical components are shown in the lumped model of the distributed series diode bit line 16a, the metal layer 17, material layer 21, and semiconductor layer 19 are continuous for the entire length of the bit line 16. As shown in FIG. 4, a memory cell 18 has not been selected for the read operation. Once a memory cell 18 is chosen, such as target memory element 18a, target memory cell 18a will have a nearest number of unselected word lines 14, which along with the selected word line 14a, will form an effective word line group 15, as shown in FIG. 5. The cumulative lateral resistance of the bit line 16a, as determined by a defined lateral resistance per unit length, increases farther from the target memory cell 18a, thereby reducing the effects of distant elements in the memory array 12 (FIG. 1) and forming the effective group of word lines 15. For ease of description, a group of three word lines 14 is used to describe a read operation of the target memory cell 18a.

Figure 6:
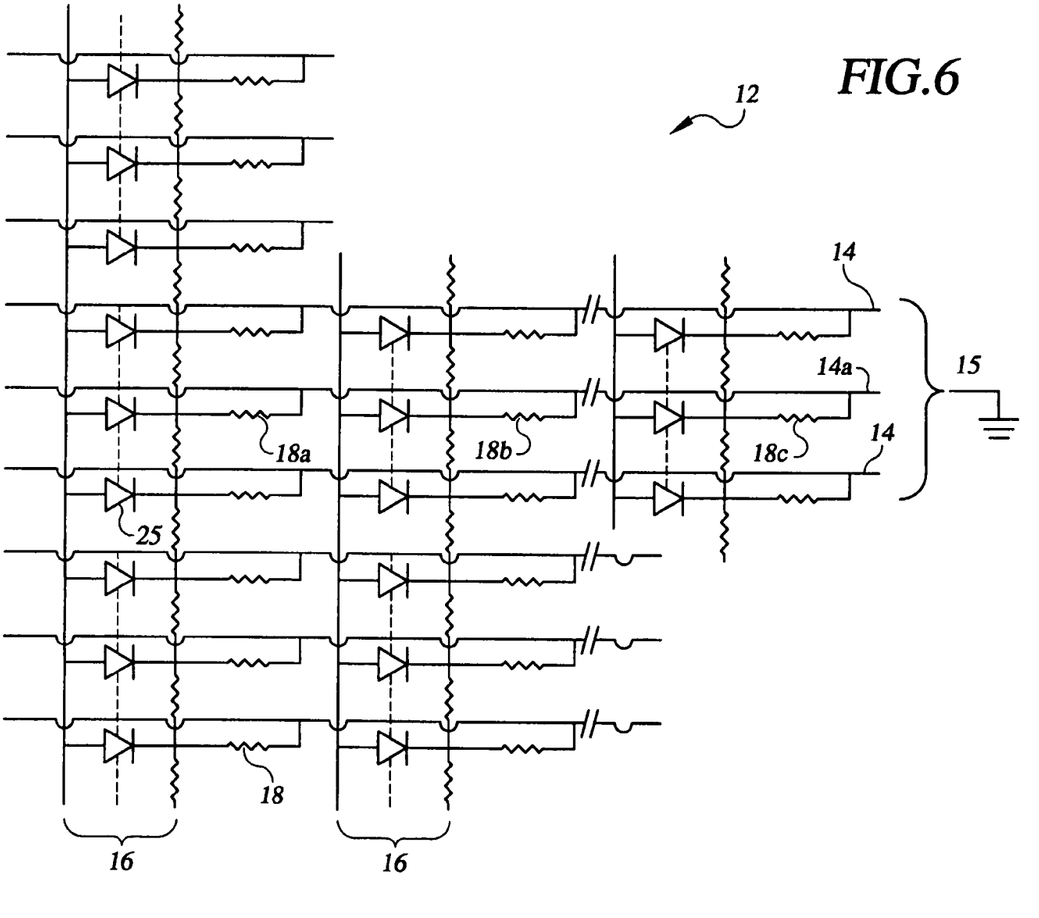
FIG. 6 is a circuit diagram of an embodiment of a portion of the resistive cross point memory cell array shown in FIG. 1.

Referring to the embodiment of FIG. 6, the lateral resistance of the distributed series diode bit line 16 is selected such that the memory elements 18 and their respective word lines 14 are formed into groups of three about a target memory cell 18a. Within the effective group of word lines 15, each memory cell 18 is connected between a respective word line 14 and segment of the distributed series diode bit line 16 which functions as a common group isolation diode, as represented by diode elements 25 connected by dashed lines. Memory array 12 features the high-speed operational advantages associated with diode isolation architectures and the high-density advantages of equipotential isolation architectures in an architecture that may be implemented with isolation diodes that have practical dimensions and current density characteristics. In some embodiments, distributed series diode bit lines 16 may be fabricated with memory cells 18 using a conventional thin film diode fabrication technology, thereby allowing multi-level resistive cross point memory arrays to be constructed.

In operation, data is sensed in a target memory cell 18a of memory array 12 by selecting a word line 14a corresponding to the selected memory cell 18a, and connecting it to a low potential (roughly the ground potential). At the same time, groups of bit lines 16 are connected to read circuits 20 in reference (18b)/sense (18a) pairs, as described in detail below in connection with FIG. 7.

The operation of an embodiment of a memory array 12 including a distributed series diode bit line will now be discussed. The memory array includes a sense amplifier as disclosed in U.S. Pat. No. 6,456,524, which is incorporated herein by reference. An array potential ($V_{ARRAY}$) is applied to the unselected bit lines 16c from the output of an equipotential generator 32, which also is described in detail below. The equipotential generator 32 applies a control voltage to the read circuits 20 coupled to the selected bit lines 16a, 16b to set bit line voltages so that the voltage that is applied to the target memory cell 18a is equal to the array potential ($V_{ARRAY}$). The equipotential generator 32 also applies a control voltage to the steering circuits 22 coupled to the unselected bit lines 16c to set the unselected bit line voltage so that the voltage that is applied to the unselected memory cells is equal to the array potential ($V_{ARRAY}$).

Unselected word lines 14 in a selected group 15 (FIG. 6) of word lines 14 are connected together and form an averaged feedback voltage as a second input to the equipotential generator 32. The equipotential generator 32 develops an output voltage ($V_G$) from the difference of the applied array voltage ($V_{ARRAY}$) and the feedback voltage to the source follower transistors 44 to achieve a voltage equal to $V_{ARRAY}$ applied to the selected reference memory cell 18b, the target memory cell 18a, and the unselected memory cell 18c connected to the selected word line 14a. In such a case, the memory elements connected to the selected word line 14a have approximately $V_{ARRAY}$ applied across them and all of the other unselected memory elements 40, 42, 43 that are associated with the selected bit lines 16 and the effective word line group 15 have approximately zero potential across them. As a result, the bit line read circuits 20 receive sense current only from the selected memory elements. The unselected word lines 14, i.e. those not in selected group 15 (FIG. 6), are connected to a high potential (on the order of twice the magnitude of the voltage drop of the distributed series diode 25) and are isolated from the selected group 15 bit lines 14 by the reverse biased distributed series diode 25. The unselected bit lines 16c have a voltage ($V_G$) applied to them so that $V_{ARRAY}$ is applied across the associated memory elements and the associated distributed series diode 25. Consequently, a parasitic bit line current flows in the unselected bit lines 16c during a read operation.

Figure 7:
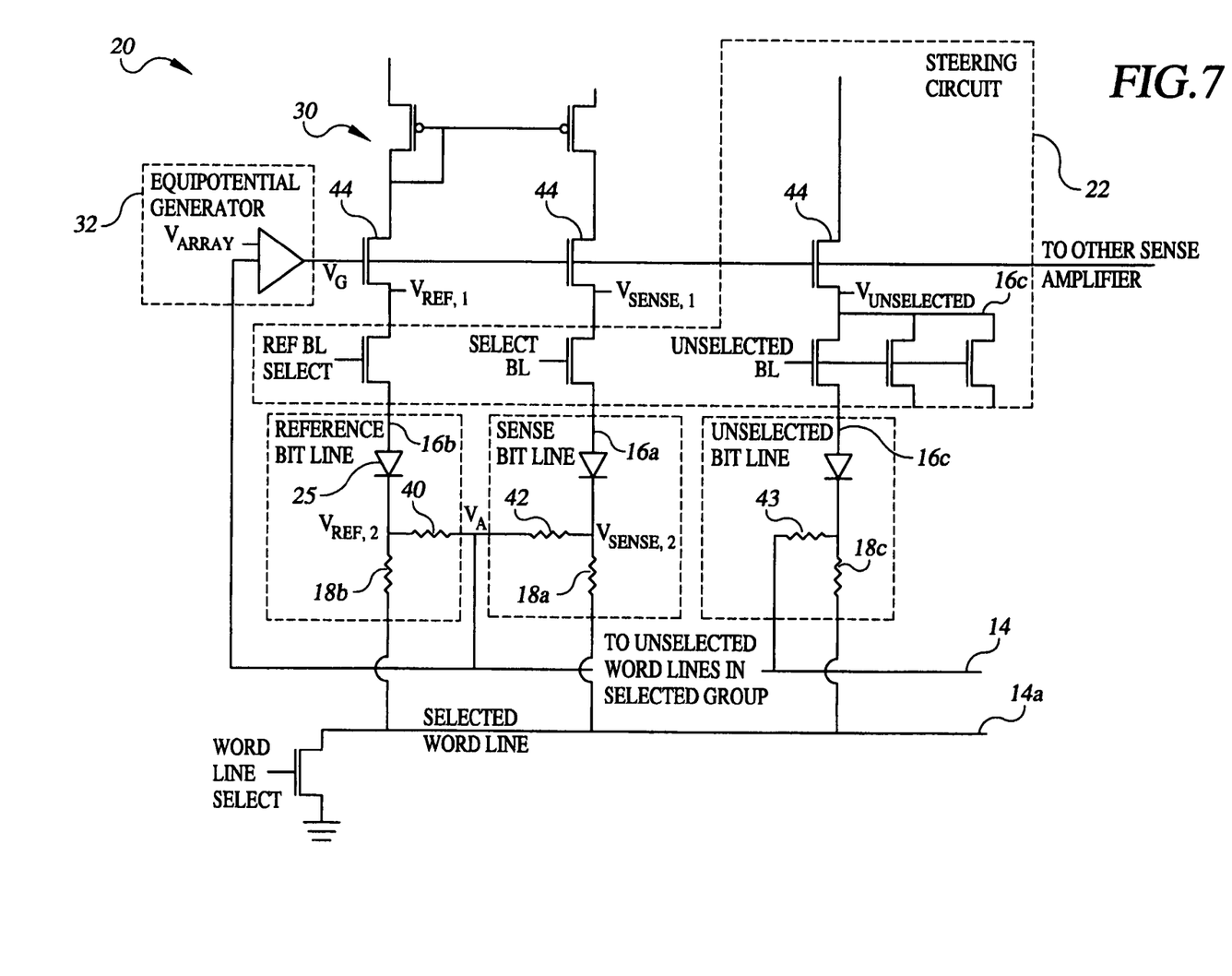
FIG. 7 is a circuit diagram of an embodiment of a sense amplifier circuit that is operable to sense current flow through a memory cell of one or more associated groups of memory cells of the resistive cross point memory cell array shown in FIG. 1.

As shown in the embodiment of FIG. 7, each read circuit 20 includes a sense amplifier circuit 30 and an equipotential generator circuit 32. Sense amplifier 30 may be implemented as a current mode differential amplifier. In the embodiment of FIG. 7, two bit lines of the memory cell array are shown: a reference bit line 16b and a sense bit line 16a. The reference bit line 16b and the sense bit line 16a are shown in equivalent circuit form having, respectively, a selected reference memory cell 18b and a target memory cell 18a; the other memory cells are represented by resistors 40, 42. In operation, a logic '1' or '0' may be sensed by detecting the difference between a current that is generated in the reference bit line and a current that is generated in the sense bit line.

During a read operation, the equipotential generator 32 develops a gate voltage signal ($V_G$) that is applied to a set of voltage follower transistors 44, one in each selected bit line. Each of the voltage follower transistors 44 sets a respective bit line voltage (e.g., $V_{REF.1}$ and $V_{SENSE1}$) to a narrow voltage range while providing a high impedance to the sense nodes in a sense amplifier circuit 30. Sense currents that flow through the voltage follower transistors 44 pass through the distributed series diode 25 and then through he selected memory elements 18a, 18b. The voltage level $V_G$ preferably is set so that the voltages $V_{REF.2}$ and $V_{SENSE2}$, which are applied across the memory elements 18a, 18b, are close to the array voltage $V_{ARRAY}$. If the voltage $V_{REF.2}$ and $V_{SENSE2}$ are equal to $V_{ARRAY}$ no parasitic current will flow through the sneak path memory elements 40, 42, as explained above. A similar action occurs for the unselected bit lines, the output of the equipotential generator ($V_G$) applies a gate voltage to a source follower associated with the unselected bit lines to apply a voltage approximately equal to $V_{ARRAY}$ to the unselected memory cells 18c so that no parasitic sneak path currents will flow in associated sneak path memory cells 43.

In the embodiment shown, all of the unselected word lines in a word line group 15 are coupled together at node A and develop an averaged voltage $V_A$ to form the feedback voltage as the second input to the equipotential generator circuit 32. Connecting the unselected word lines together forms a voltage divider circuit that samples the voltages applied to the selected memory cells. These voltages are approximately equal, and the output of the unselected memory element voltage divider represents an average of the slightly different voltages applied to the selected memory cells. In one embodiment, equipotential generator circuit 32 is implemented as an operational amplifier control circuit having a first input coupled to a source of $V_{ARRAY}$, a second input coupled to the unselected word lines 14 ($V_A$) through row select diode circuits (not shown), and an output coupled to the gates of voltage follower transistors 44. The constant array voltage may be provided by an external circuit (not shown). When $V_A$ is equal to $V_{ARRAY}$, $V_G$ is set so that $V_{REF2}$ and $V_{SENSE2}$, and $V_A$ all have approximately the same magnitude so that an insubstantial current will flow across node A. This technique also works well when multiple sense amplifiers are used, i.e., when multiple bit pairs are sensed at the same time.

In addition to effectively grouping word lines 14 and therefore allowing for the effective application of equipotential isolation, the lateral resistance of a distributed series diode bit line 16 provides short tolerance and prevents sneak path currents within the word line group 15. Short tolerance and the prevention of sneak currents will now be discussed with reference to FIG. 8. If a memory cell 18 other than the selected memory cell 18a is shorted, its resistance will be the resistance of a portion of the distributed series diode bit line 16, that resistance being at least the resistive value of resistive element 27. The selected memory cell 18a is represented by a first resistor 50, and unselected memory cells are represented by second and third resistors 52 and 54. The first resistor 50 is selected by applying an operating voltage ($V_s$) to the bit line 16 and a ground to the associated word line 14a. To prevent sneak path currents from obscuring a sense current, an equal operating potential ($V_b=V_s$) is applied to the unselected word lines 14. Applying equal potential across the unselected memory cells 18d, 18e blocks sneak path currents from flowing therethrough.

Figure 8:
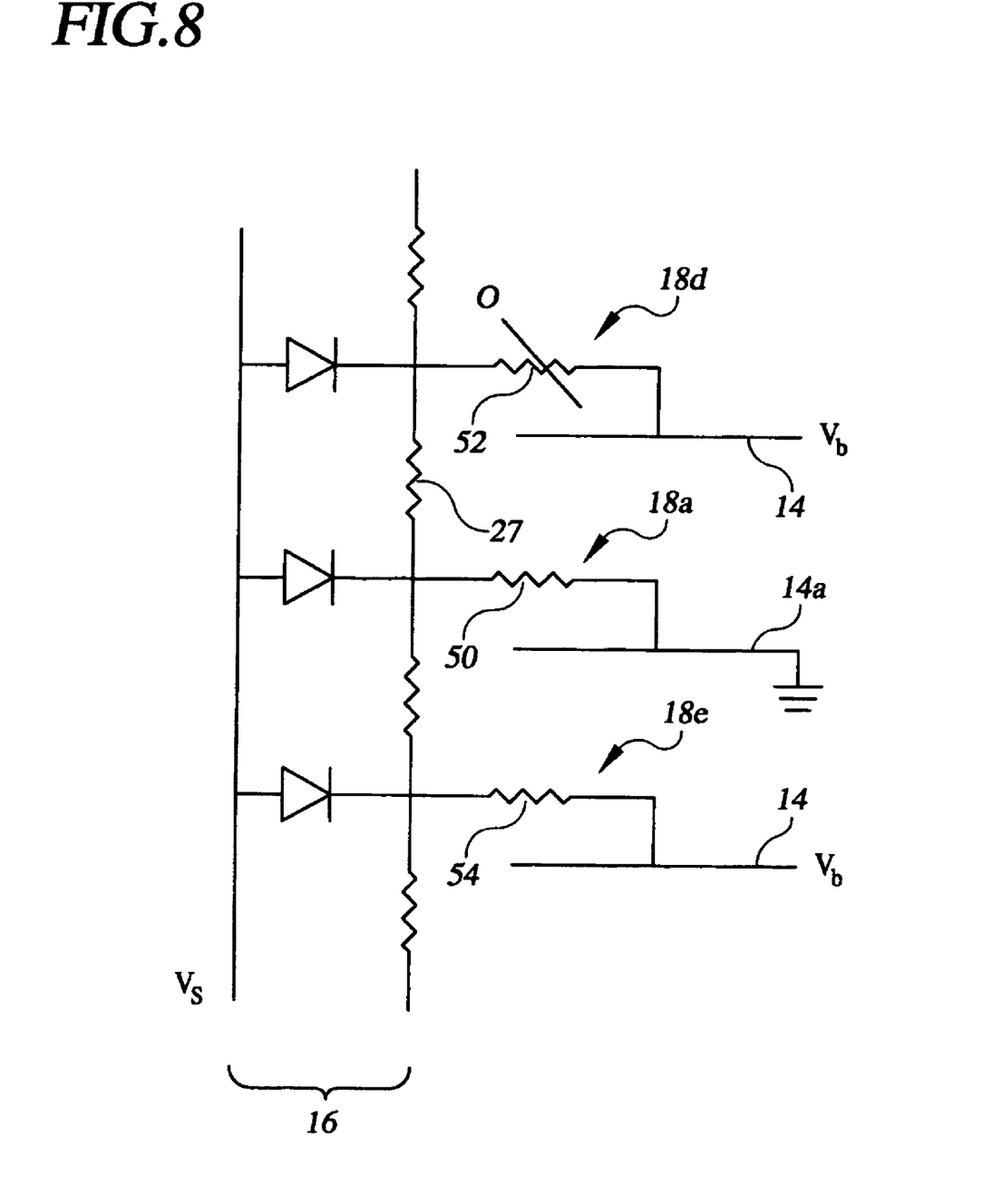
FIG. 8 is a circuit diagram of an embodiment of a portion of the resistive cross point memory cell array shown in FIG. 1

Ideal sense amplifiers apply an equal potential to the selected bit line and the subset of unselected word and bit lines. If, however, the sense amplifiers are not ideal, the potentials are not exactly equal and sneak path currents can flow through the memory array 12 (FIG. 1) during read operations.

Consider a read operation on a selected memory cell 18a lying along the same bit line as a shorted memory element 18d (resistive element 52). The shorted memory cell 18d has a resistance at least equal to the resistance of the associated segment of the distributed series diode bit line 27. Even if the sense amplifiers are not ideal, the shorted memory cell 18d does not divert a significant amount of sneak path current through the shorted memory cell 18d and does not significantly affect the sense current during read operations. As a result, the shorted memory cell 18d does not cause a column-wide failure. Only a single randomized bit error results. The single randomized bit error can be quickly and easily corrected by error code correction.

Now compare the read operation just described with a read operation involving conventional memory elements and non-ideal sense amplifiers. A conventional shorted memory element would draw a significant sneak path current that, when combined with the sense current, would cause the sense amplifier to cut-off or saturate. As a result, a bit error would occur during a read operation on the selected memory element configuration. Moreover, the shorted memory element of the conventional configuration would divert the sense current during read operations in every other memory element of the bit line. A column-wide error would result.

The invention claimed is:

1. A method for forming a data storage device, comprising:
    forming a plurality of word lines in a first plane;
    forming a plurality of memory elements on the plurality of word lines; and
    forming a plurality of bit lines, each bit line being a distributed series diode, the plurality of bit lines being disposed in a second plane that is substantially parallel to the first plane, thereby forming a plurality of cross-points with the plurality of word lines;
    wherein each memory element is disposed at one of the cross points.

2. The method of claim 1, wherein forming a distributed series diode further comprises:
    forming a semi-conductor layer;
    forming a material layer; and
    forming a metal layer.

3. The method of claim 1, further comprising forming multiple read circuits, each read circuit being coupled to at least one bit line and operable to sense current flow through a selected memory cell.

4. The method of claim 3, wherein each read circuit comprises a differential amplifier.

5. The method of claim 4, wherein the differential amplifier is operable to compare current flowing through a selected memory cell with current flowing through at least one reference cell.

6. The method of claim 5, further comprising forming an equipotential generator coupled to the word lines and the bit lines and operable to set voltage levels in the memory device to prevent parasitic currents from flowing through unselected memory cells.

7. A method for forming a data storage device, comprising:
    forming a plurality of word lines;
    forming a plurality of memory elements on the plurality of word lines;
    forming at least one distributed series diode; and
    forming a plurality of cross-points with a plurality of word lines;
    wherein each memory element is disposed at one of the cross points and the at least one distributed series diode is adjacent to one of the plurality of bit lines.

8. The method of claim 7, wherein forming a distributed series diode further comprises:
    forming a semi-conductor layer;
    forming a material layer; and
    forming a metal layer.

9. The method of claim 7, wherein forming a distributed series diode further comprises forming a distributed series diode adjacent each bit line.

10. A method for using a data storage device, comprising:
    providing an array of memory elements located at cross-points of word lines and bit lines, the word lines being arranged in a first plane, the bit lines being arranged in a second plane, each of the bit lines comprising a distributed series diode; and
    selectively isolating a first group of the memory elements from remaining memory elements along a first of the bit lines.

11. The method of claim 10, further comprising preventing parasitic currents from flowing through unselected ones of the memory elements.

12. The method of claim 11, wherein preventing parasitic currents comprises using an equipotential generator coupled to the word lines and the bit lines.

13. The method of claim 10, wherein selectively isolating comprises using feedback from an unselected one of the word lines.

14. The method of claim 10, further comprising storing data in at least some of the memory elements.

15. The method of claim 14, further comprising reading data from a selected one of the memory elements.

16. The method of claim 15, wherein reading data comprises sensing current flow through the selected one of the memory elements.

17. The method of claim 16, wherein reading data further comprises comparing the current flow through the selected one of the memory elements with current flowing through at least one reference memory element.

18. The method of claim 16, wherein reading data comprises converting an analog differential sense voltage to a digital output read signal.

19. The method of claim 10, wherein providing an array of memory elements comprises forming the distributed series diode with a semi-conductor layer, a material layer and a metal layer.

20. The method of claim 19, wherein the material layer is located between the semi-conductor layer and the metal layer.

* * * * *